(12) United States Patent
Savelainen

(10) Patent No.: US 6,798,202 B2
(45) Date of Patent: Sep. 28, 2004

(54) PLANAR RADIO FREQUENCY COIL FOR OPEN MAGNETIC RESONANCE IMAGING SYSTEMS

(75) Inventor: Matti Kullervo Savelainen, Espoo (FI)

(73) Assignee: Koninklijke Philips Electronics N.V., Eindhoven (NL)

( * ) Notice: Subject to any disclaimer, the term of this patent is extended or adjusted under 35 U.S.C. 154(b) by 245 days.

(21) Appl. No.: 09/991,761

(22) Filed: Nov. 23, 2001

(65) Prior Publication Data

US 2003/0100826 A1 May 29, 2003

(51) Int. Cl.$^7$ ................................................. G01V 3/00
(52) U.S. Cl. ..................................... 324/318; 324/309
(58) Field of Search .............................. 324/318, 322, 324/207, 309; 128/653.5

(56) References Cited

U.S. PATENT DOCUMENTS

| | | |
|---|---|---|
| 4,721,913 A | 1/1988 | Hyde et al. |
| 4,825,162 A | 4/1989 | Roemer et al. |
| 4,918,388 A | 4/1990 | Mehdizadeh et al. |
| 5,128,615 A | 7/1992 | Oppelt et al. |
| 5,153,517 A | 10/1992 | Oppelt et al. |
| 5,198,768 A | 3/1993 | Keren |
| 5,256,971 A | 10/1993 | Boskamp |
| 5,315,251 A | 5/1994 | Derby |
| 5,394,087 A | 2/1995 | Molyneaux |
| 5,578,925 A | 11/1996 | Molyneaux et al. |

FOREIGN PATENT DOCUMENTS

DE 199 14 989 A1 10/2000

OTHER PUBLICATIONS

"The NMR Phased Array", Roemer, et al.; Academic Press, Inc. 1990.

"Weighting Functions for Combination of NMR Images Obtained with Multiple Surface Coils", Reykowski, et al.; p. 519, SMRM Aug., 1990 9$^{th}$ Annual Meeting.

"Modification of an MR Receiver for Simultaneous Image Acquisition From Two Channels", Wright, et al.; p. 533, SMRM Aug. 1989 8$^{th}$ Annual Meeting.

"Improvement of SNR at Low Field Strength Using Mutually Decoupled Coils For Simultaneous NMR Imaging", Leussler, et al.; p. 724, SMRM Aug. 1990 9$^{th}$ Annual Meeting.

"Volume Imaging with MR Phased Arrays", Hayes, et al.; p. 175, SMRM Aug. 1989 8$^{th}$ Annual Meeting.

"Planar Strip Array (PSA) for MRI", Lee, et al.; p. 673–683, Magnetic Resonance in Medicine 45 (2001).

*Primary Examiner*—Brij B. Shrivastav
(74) *Attorney, Agent, or Firm*—Thomas M. Lundin

(57) ABSTRACT

A magnetic resonance imaging apparatus is provided. The magnetic resonance imaging apparatus includes a main magnet assembly for generating a main magnetic field in a main magnetic field direction in an examination region, a gradient coil assembly for generating magnetic gradient fields in the main magnetic field within the examination region, a radio frequency transmit coil assembly for exciting resonance in selected dipoles within a subject disposed in the examination region such that the dipoles generate circularly polarized resonance signals at a characteristic resonance frequency, a radio frequency receive coil assembly for receiving the circularly polarized resonance signals generated by the dipoles, and a reconstruction processor for reconstructing the received signals into an image representation. The radio frequency receive coil assembly is disposed in the examination region substantially perpendicular to the main magnetic field direction and includes a substantially planar substrate and an array of quadrature coils disposed on the substrate. Each quadrature coil includes a first loop portion disposed on a first surface of the substrate and a second loop portion disposed on a second surface of the substrate.

18 Claims, 8 Drawing Sheets

PLANAR RADIO FREQUENCY COIL FOR OPEN MAGNETIC RESONANCE IMAGING SYSTEMS

BACKGROUND

The present invention relates to the magnetic resonance arts. It finds particular application in conjunction with magnetic resonance imaging in open, or C-magnet, magnetic resonance imaging systems and will be described with particular reference thereto. However, it is to be appreciated that the present application will also find application in conjunction with other magnetic resonance imaging, functional magnetic resonance imaging, and spectroscopy systems in which the $B_0$ primary magnetic field is orthogonal to the plane of the radio frequency coils.

Conventionally, magnetic resonance imaging procedures include disposing a subject in a substantially uniform, primary magnetic field $B_0$. Dipoles in the subject preferentially align with the $B_0$ field. Magnetic resonance is excited in the dipoles by transmitting radio frequency excitation signals into the examination region. Radio frequency signals emanating from the resonating dipoles are thereafter received by radio frequency coils and are processed to form readable images.

Most commonly, the $B_0$ field is generated along the central bore of an annular magnet assembly, i.e., the $B_0$ field aligns with the central axis of the patient. Cylindrical radio frequency and gradient magnetic field coils surround the bore. In order to improve the signal-to-noise ratio, quadrature surface coils have been utilized to examine a region of interest in quadrature, i.e., to receive signal components that are perpendicular to the coil and components that are parallel to the coil. See, for example, U.S. Pat. No. 4,918,388 of Mehdizadeh, which illustrates a loop coil and a flat Helmholtz coil, both of which receive resonance signals from the same region. The loop and flat Helmholtz coils are sensitive to orthogonal components of the magnetic resonance signal emanating from dipoles that are aligned with the horizontal magnetic field. When the output of one of the loop and flat Helmholtz coils is shifted by ninety degrees and the two signals are combined, the signal-to-noise ratio is improved by about the square root of two.

In order to examine larger regions of a subject disposed in the bore of a horizontal $B_0$ field imager, surface coils consisting of a plurality of loop coils have also been used. See, for example U.S. Pat. No. 4,825,162 of Roemer and Edelstein. More specifically, a series of loop coils are partially overlapped in order to examine contiguous regions. As explained mathematically by Grover in "Inductance Calculations" (1946) and summarized in the Roemer and Edelstein patent, the mutual inductance between adjacent coils is minimized when the coils are positioned by a slight overlap. Although the use of overlapped loop coils with the induction minimized enabled a larger area to be examined, each coil was linear. That is, each coil was sensitive to only one component and not sensitive to the orthogonal component such that no quadrature detection was provided.

U.S. Pat. No. 4,721,913 of Hyde, et al. illustrates another surface coil technique for horizontal field magnets. A series of linear coils are arranged continuous to each other, but with each coil disposed ninety degrees out-of-phase with adjacent coils. Thus, each coil received a radio frequency magnetic resonance signal component that was orthogonal to its neighbors.

In U.S. Pat. No. 5,394,087 of Molyneaux, a loop and flat Helmholtz coil are superimposed to provide a flat quadrature coil. A plurality of these flat quadrature coils are partially overlapped to define a planar, quadrature coil array.

While the above-referenced surface coils are effective for horizontal $B_0$ field magnetic resonance imaging equipment, all magnetic resonance imaging equipment does not employ a horizontal $B_0$ field. C-magnet magnetic resonance imagers include a pair of parallel disposed pole pieces which are interconnected by a C or U-shaped iron element. The iron element may be a permanent magnet or can be electrically stimulated by encircling coils to a magnetic condition. Typically, the pole pieces are positioned horizontally such that a vertical field is created in between. Thus, in an annular bore magnetic field imager, the $B_0$ field extends between the subject's head and feet; whereas, in a C-shaped magnet the $B_0$ magnetic field extends between a patient's back and front. Due to the ninety degree rotation of the $B_0$ field between the horizontal and vertical field magnets, quadrature surface coils such as illustrated in the above-referenced U.S. Pat. No. 5,394,087, when positioned along the subject in a vertical $B_0$ field magnetic resonance imager, would not function in quadrature. They would loose sensitivity to one of their modes.

The present invention provides a new and improved radio frequency coil that provides quadrature reception/transmission in vertical $B_0$ field magnets.

SUMMARY

In accordance with one aspect of the present invention a magnetic resonance imaging apparatus is provided. The magnetic resonance imaging apparatus includes a main magnet assembly for generating a main magnetic field in a main magnetic field direction in an examination region, a gradient coil assembly for generating magnetic gradient fields in the main magnetic field within the examination region, a radio frequency transmit coil assembly for exciting resonance in selected dipoles within a subject disposed in the examination region such that the dipoles generate circularly polarized resonance signals at a characteristic resonance frequency, a radio frequency receive coil assembly for receiving the circularly polarized resonance signals generated by the dipoles, and a reconstruction processor for reconstructing the received signals into an image representation. The radio frequency receive coil assembly is disposed in the examination region substantially perpendicular to the main magnetic field direction and includes a substantially planar substrate and an array of quadrature coils disposed on the substrate. Each quadrature coil includes a first loop portion disposed on a first surface of the substrate and a second loop portion disposed on a second surface of the substrate.

In accordance with a more limited aspect of the present invention the second loop portion includes an offset from the first loop portion, the offset including a displacement in a direction perpendicular to the main magnetic field direction whereby mutual inductance between adjacent quadrature coils in the array is substantially eliminated.

In accordance with a more limited aspect of the present invention the main magnet assembly includes a vertical field magnet.

In accordance with a more limited aspect of the present invention the radio frequency coil assembly includes a surface coil.

In accordance with a more limited aspect of the present invention the first and second loop portions are hexagonally shaped.

In accordance with a more limited aspect of the present invention the first loop portion is capacitively coupled to the second loop portion to form a plurality of coils, each of the plurality of coils being sensitive to radio frequency signals perpendicular to the main magnetic field direction.

In accordance with a more limited aspect of the present invention the second loop portion includes a common ground loop.

In accordance with a more limited aspect of the present invention there is no overlap between adjacent quadrature coils in the array of quadrature coils.

In accordance with a more limited aspect of the present invention each quadrature coil further includes at least two takeoff points for taking signals off the quadrature coil and a phase shifter and combiner associated therewith for combining the signals in quadrature.

In accordance with another aspect of the present invention a method of magnetic resonance imaging is provided. The method includes the steps of generating a main magnetic field in a main direction in an examination region, generating magnetic field gradients in the main magnetic field, transmitting radio frequency signals into the examination region to excite selected dipoles in a subject disposed in the examination region such that the dipoles are circularly polarized in a plane perpendicular to the main direction, and receiving circularly polarized radio frequency signals from the excited dipoles using a receive coil assembly. The receive coil assembly includes an array of quadrature coils, each quadrature coil for receiving the radio frequency signals from the circularly polarized dipoles.

In accordance with a more limited aspect of the present invention the method further includes the steps of taking off signals from each quadrature coil from at least two takeoff points, phase shifting the signals from the at least two takeoff points, and combining the phase shifted signals in quadrature.

In accordance with a more limited aspect of the present invention the step of generating the main magnetic field includes generating a vertical magnetic field using an open magnet.

In accordance with a more limited aspect of the present invention the array of quadrature coils includes a two dimensional array and the array is disposed in the examination region substantially perpendicular to the main direction.

In accordance with a more limited aspect of the present invention each quadrature coil includes a first loop portion disposed on a first side of a substrate and a second loop portion disposed on a second side of a substrate, opposite the first side, such that there is substantially no mutual inductance between adjacent quadrature coils of the array.

In accordance with another aspect of the present invention, radio frequency receive coil assembly for receiving circularly polarized resonance signals in a magnetic resonance imaging system is provided. The radio frequency receive coil assembly includes a substantially planar substrate and an array of quadrature coils disposed on the substrate. Each quadrature coil includes a first loop portion disposed on a first surface of the substrate and a second loop portion disposed on a second surface of the substrate, the second surface being opposite the first surface.

In accordance with a more limited aspect of the present invention adjacent quadrature coils in the array are disposed relative to one another such that there is substantially no mutual inductance between the adjacent coils.

In accordance with a more limited aspect of the present invention there is no overlap between the adjacent coils.

In accordance with a more limited aspect of the present invention the assembly includes a surface coil.

In accordance with a more limited aspect of the present invention the array includes a two-dimensional array and the circularly polarized radio frequency signals include signals in a direction that is parallel to the array.

In accordance with a more limited aspect of the present invention the assembly further includes a radio frequency transmit coil.

One advantage of the present invention is that it provides a quadrature radio frequency receive coil that is substantially planar in a direction perpendicular to the main magnetic field of a magnetic resonance imaging system.

Another advantage of the present invention is that it provides a radio frequency coil that is oriented in a plane which is perpendicular to the main field of an open magnet and receives circularly polarized signals oriented in that plane.

Another advantage of the present invention is that the radio frequency coil is useful in phased array applications.

Another advantage of the present invention is that the radio frequency coil is useful in parallel spatial-encoding techniques such as SMASH, SENSE, and ASP.

Another advantage of the present invention is that the mutual inductance between coils of the radio frequency coil is eliminated.

Another advantage of the present invention is that the radio frequency coils are relatively thin and flat.

Still further advantages of the present invention will become apparent to those of ordinary skill in the art upon reading and understanding the following detailed description of the preferred embodiments.

DRAWINGS

The invention may take form in various components and arrangements of components, and in various steps and arrangements of steps. The drawings are only for purposes of illustrating a preferred embodiment and are not to be construed as limiting the invention.

DESCRIPTION

Figure 1:
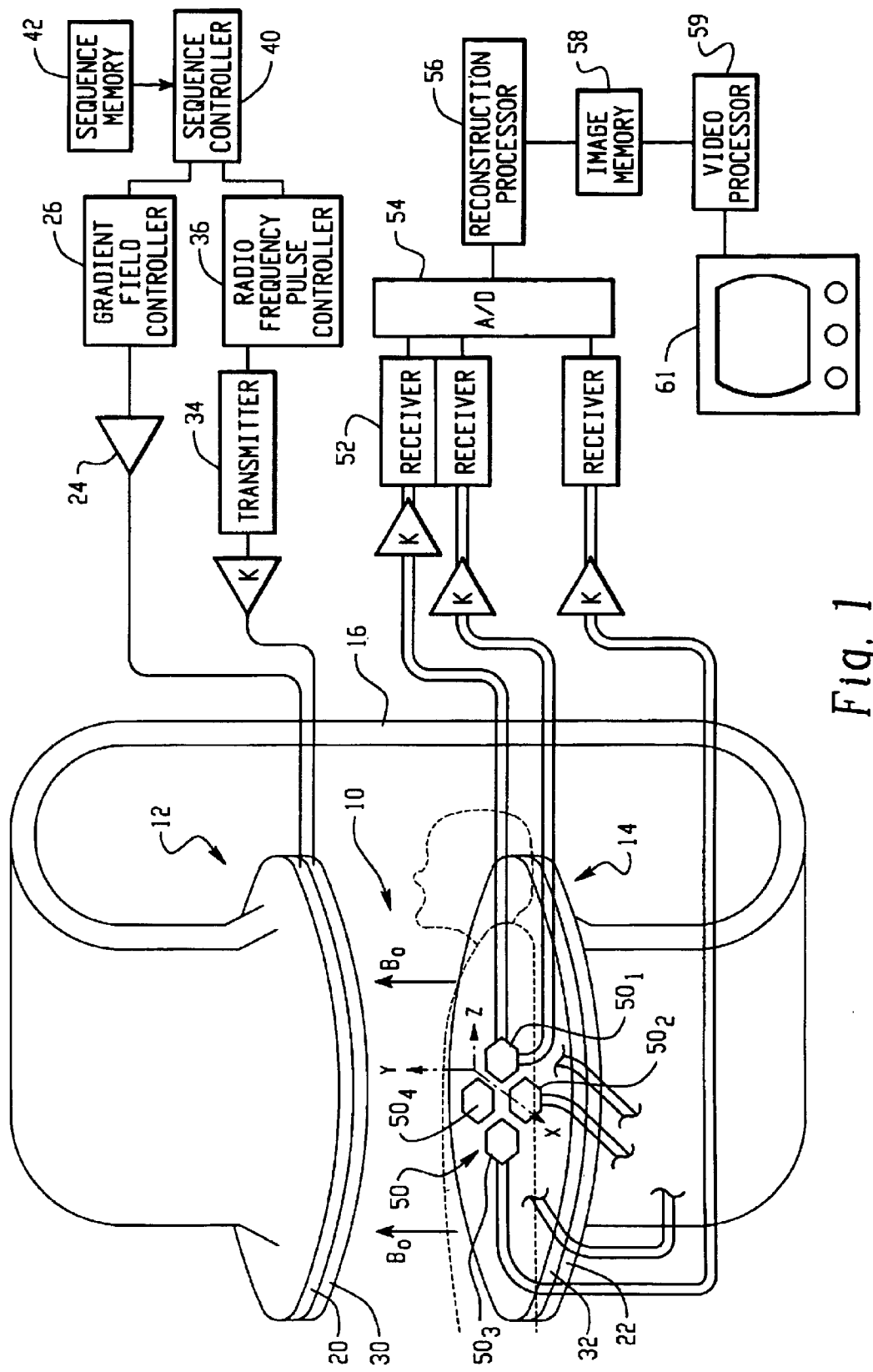
FIG. 1 is a diagrammatic illustration of a magnetic resonance system in accordance with the present invention.

With reference to FIG. 1, an imaging region 10 is defined between pole pieces 12, 14. The pole pieces are interconnected by a ferrous flux path 16, such as a C or U-shaped iron element. In a preferred embodiment, the iron element 16 is a permanent magnet which causes a vertical $B_0$ magnetic field between the pole faces across the imaging region. Alternately, electrical windings may be provided for inducing the magnetic flux in the ferrous flux path 16 and the $B_0$ field across the pole faces. Passive or active shims are disposed at the pole pieces or in the ferrous flux path adjacent the pole pieces to render the vertical $B_0$ field more linear across the imaging region 10.

For imaging, magnetic field gradient coils 20, 22 are disposed at the pole pieces 12, 14. In the preferred embodiment, the gradient coils are planar coil constructions which are connected by gradient amplifiers 24 to a gradient magnetic field controller 26. The gradient magnetic field controller, as is known in the art, causes current pulses which are applied to the gradient coils such that gradients in the uniform magnetic field are created along the longitudinal or z-axis, the vertical or y-axis, and the transverse or x-axis.

In order to excite magnetic resonance in dipoles of a subject disposed in the examination region 10, radio frequency coils 30, 32 are disposed between the gradient coils and the imaging region. A radio frequency transmitter 34, preferably a digital transmitter, causes the radio frequency coils to transmit radio frequency pulses requested by a radio frequency pulse controller 36 to be transmitted into the imaging region 10. A sequence controller 40, under operator control, retrieves an imaging sequence from a sequence memory 42. The sequence controller 40 provides the sequence information to the gradient controller 26 and the radio frequency pulse controller 36 such that radio frequency and gradient magnetic field pulses in accordance with the selected sequence are generated.

A radio frequency surface coil assembly 50 is disposed along a region of interest of the subject. Typically, the radio frequency coils 30, 32 are general purpose coils and are built-in. On the other hand, specialty surface coils are removable for greater flexibility. However, the surface coil 50 and the below-described alternate embodiments can be the only radio frequency coils in the system, i.e. the coil 50 can be used as both a radio frequency transmitter and receiver. In the embodiment of FIG. 1, the surface coil assembly 50 is an array of coils that is disposed on a subject supporting surface immediately below the subject resting on the subject supporting surface. The surface coil assembly 50 with radio frequency receivers 52 demodulates the radio frequency resonance signals received by the built-in and/or removable radio frequency coils. As is explained in greater detail below in conjunction with FIGS. 3A and 3B and 4, the surface coil assembly 50 is an array of coils $50_1 \ldots 50_n$, each connected with one or more receivers 52. Signals from the receivers are digitized with an array of analog-to-digital converters 54 and processed by a reconstruction processor 56 into volumetric image representations which are stored in a volumetric image memory 58. A video processor 60, under operator control, withdraws selected image data from the volume memory and formats it into appropriate format for display on a human-readable display 62, such as a video monitor, active-matrix monitor, liquid crystal display, or the like.

Figure 2:
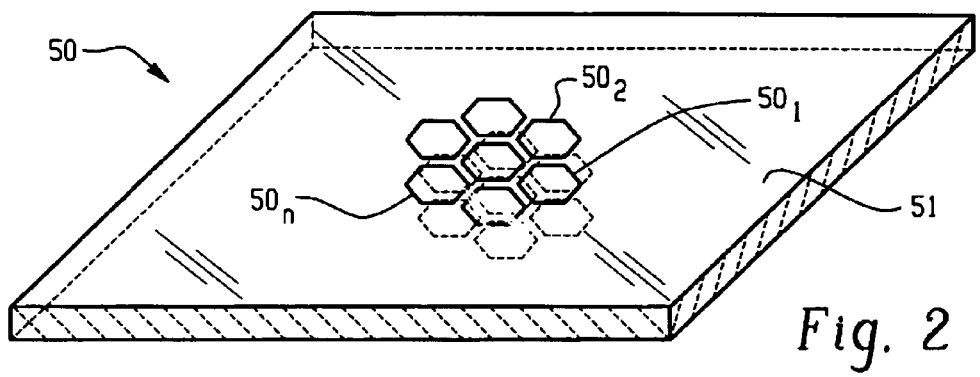
FIG. 2 is a diagrammatic illustration of a radio frequency coil array.
Figure 3A:
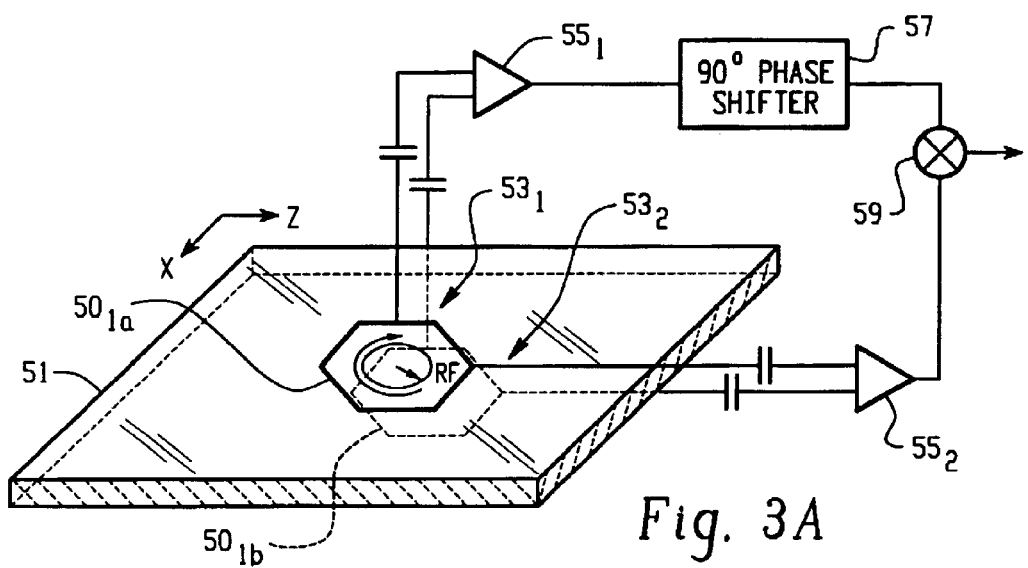
FIG. 3A is an enlarged view of one of the coils of the radio frequency coil array.
Figure 3B:
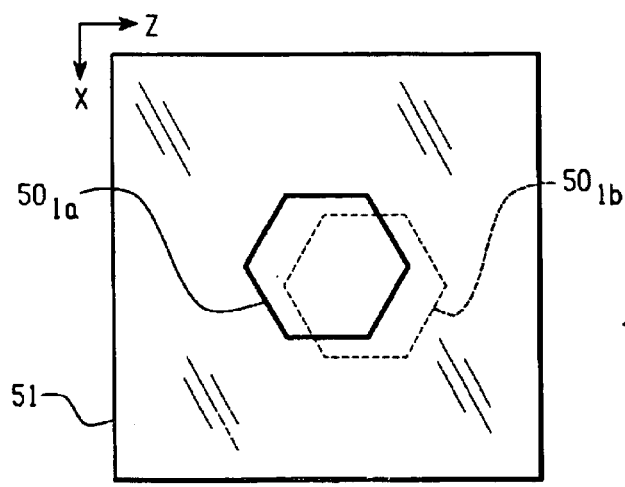
FIG. 3B is a planar drawing of one of the coils of the radio frequency coil array.

With reference to FIG. 2, the coil assembly 50 includes a plurality of quadrature coils $50_1 \ldots 50_n$ of similar construction disposed on a substrate 51. Each quadrature coil, $50_1 \ldots 50_n$ has two modes, one in the x-direction and one in the z-direction. With reference to FIG. 3A, in a preferred embodiment, each quadrature coil includes a first loop $50_{1a}$, and a second loop $50_{1b}$ for detecting the circularly polarized radio frequency field RF rotating in the plane of the loops as shown. The first loop $50_{1a}$ and second loop $50_{1b}$ are disposed on opposite sides of the substrate 51 from each other and, as will be describe more fully below, are displaced in the x and z directions relative to one another as shown in FIG. 3B. It is to be understood, however, that depending on the geometry of the first and second loops, the displacement can be in only the x or z direction. In a preferred embodiment, the substrate is made out of a high permittivity material such as glass, quartz, or piezoelectric material. By using a high permittivity material, the radio frequency wave length can be reduced to practical human size dimensions even for sub-Tesla proton frequencies and it becomes possible to adjust the loop geometry so that the standing wave condition is fulfilled in the two loops on opposite sides of the substrate. All loop pairs are dimensioned so that they have the standing wave condition at the operating frequency range of the magnetic resonance imaging system. As generally shown in the figures, the first and second loops $50_{1a}$, $50_{1b}$ are preferably in the shape of a hexagon so as to optimize the filling of the substrate 51 by quadrature coils $50_1 \ldots 50_n$. It is to be appreciated, however, that the quadrature coils $50_1 \ldots 50_n$ are not limited to such a geometry.

Continuing with FIG. 3A, each quadrature coil $50_1 \ldots 50_n$ has two take-off points $53_1$, $53_2$. As can be seen in FIG. 3A, the take-off point for the radio frequency signal in the x-direction $53_1$ is displaced ninety degrees, in the plane defined by the substrate 51, from the take-off $53_2$ for the radio frequency signal in the z-direction. The signals from the take-off points preferably capacitively coupled to preamplifiers $55_1$, $55_2$ where they are preamplified. The signals are then combined in quadrature using a phase shifter 57 and combiner 59.

Figure 4:
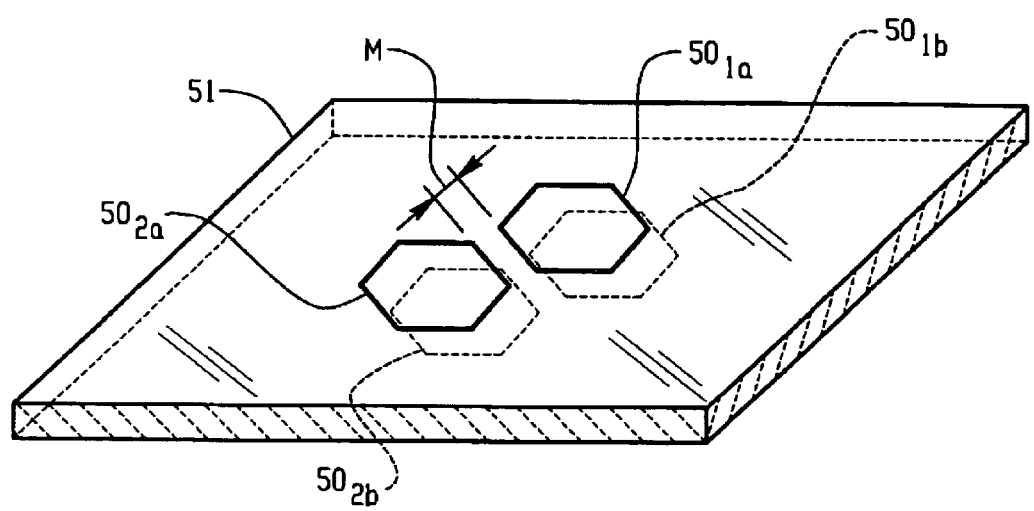
FIG. 4 is a diagrammatic illustration showing the area of mutual inductance between two radio frequency coils.

With reference to FIG. 4, for an embodiment having two quadrature coils $50_1$, $50_2$ there are four modes: two x-modes and two z-modes. The x-modes and z-modes within each coil pair are orthogonal to each other and have minimum mutual inductance due to the symmetry. However, mutual inductance between the two coil pairs $50_1$, $50_2$ can occur in the region M between the pairs.

The mutual inductance between the quadrature coils $50_1$, $50_2$ can be modeled using a two-dimensional approximation of the mutual inductance between two infinitely long conductor pairs A and B having current i running through them as shown in FIGS. 5A, 5B, 5C and 5D.

Figure 5A:
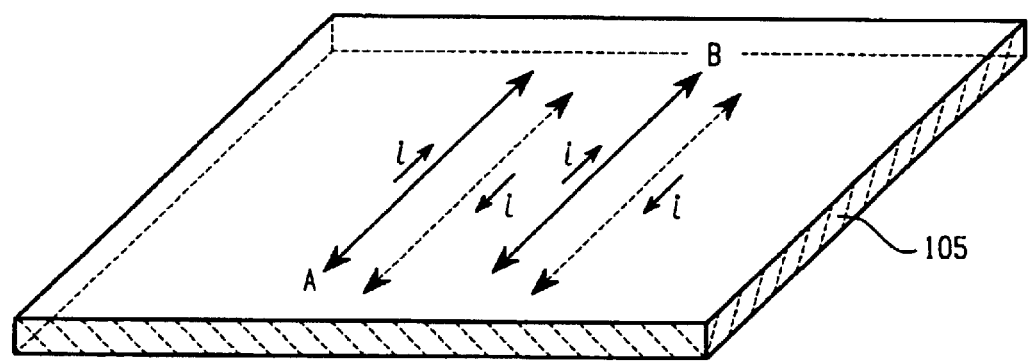
FIG. 5A is a perspective drawing of the mutual inductance between pairs of infinitely long conductors.
Figure 5B:
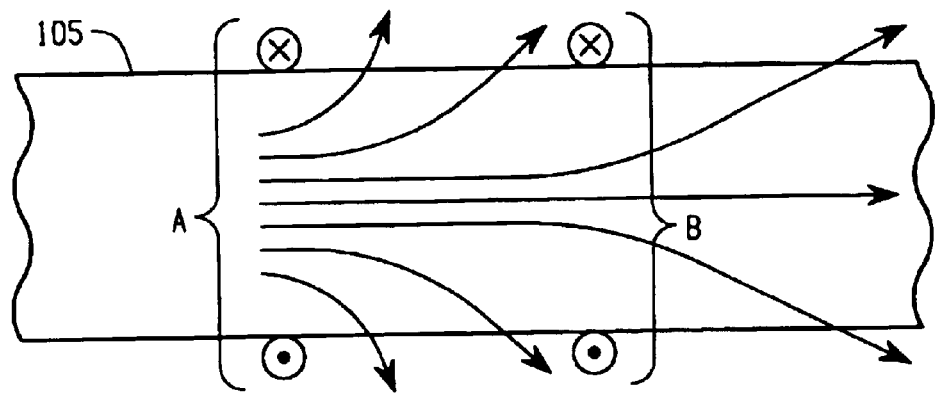
FIG. 5B is a planar drawing of the mutual inductance between pairs of infinitely long conductors.
Figure 5C:
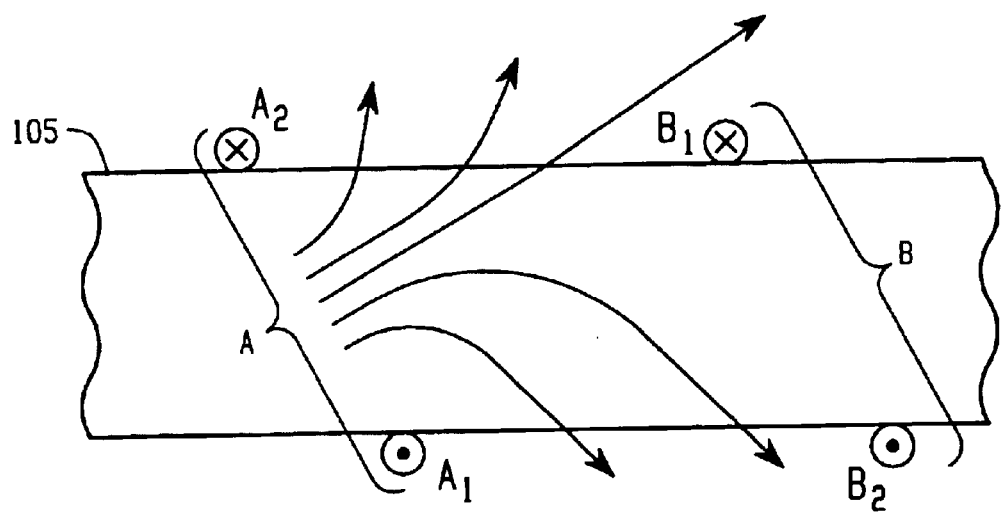
FIG. 5C is a planar drawing of the mutual inductance between pairs of infinitely long conductor pairs when the pairs are tilted.

As can be seen in FIGS. 5A and 5B, magnetic flux from infinitely long conductor pair A induces current in infinitely long conductor pair B, both pairs being disposed on a substrate 105. If, however, the conductor pairs A, B are properly tilted, as shown in FIG. 5C, the mutual inductance between the pairs can be reduced to zero.

Figure 5D:
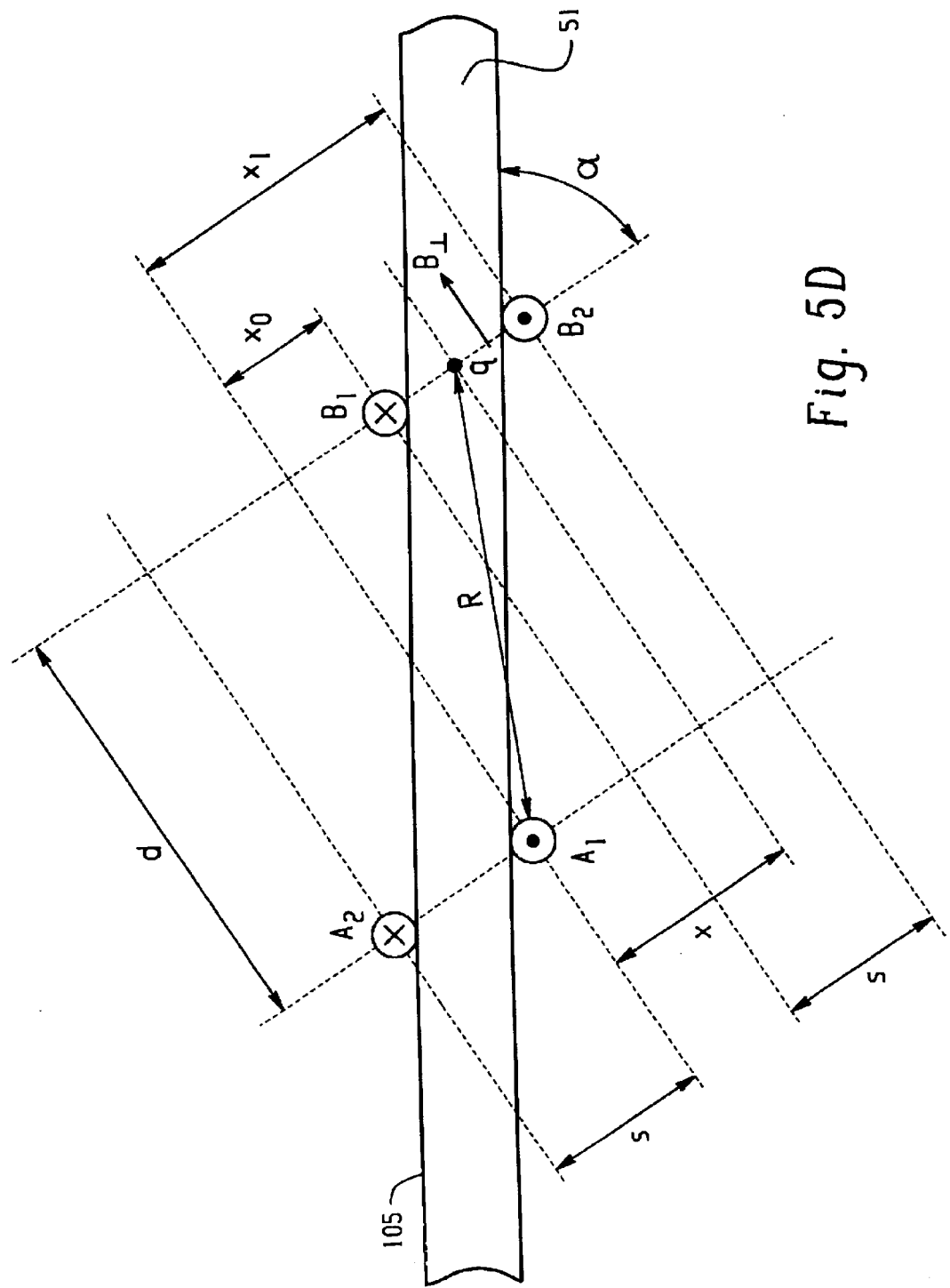
FIG. 5D is a planar drawing of two pairs of infinitely long conductors showing the geometric parameters involved in making the mutual inductance between the pairs zero.

With more specific reference to FIG. 5D and the following equations, it can be seen how the mutual inductance between the conductor pairs is eliminated.

According to the Biot Savart Law, the magnetic field at a point a distance r from an infinitely long wire carrying current I has magnitude B, where:

$$B = \mu_0 I / 2\pi r \quad (1)$$

and $\mu_0$ is the magnetic permeability constant of free space.

Therefore, the magnetic field magnetic field at an arbitrary point q, as shown in FIG. 5D, resulting from the current I flowing in conductor $A_1$ of conductor pair A can be calculated as:

$$B_q = \mu_0 I / 2\pi R \quad (2)$$

where R is the distance between conductor $A_1$ and point q. From the geometry shown in FIG. 5D is can be seen that $$R = (x^2 + d^2)^{1/2} \quad (3)$$

where d is the distance between the plane containing conductor pair A and the plane containing conductor pair B and x is the distance between conductor $A_1$ and the line defined by the intersection of a plane perpendicular to the two planes defined by the conductor pairs and passing through point q. By substituting this value of R into equation (2) it follows that $$B_q = \mu_0 I / 2\pi (x^2 + d^2)^{1/2} \quad (4)$$

With regard to the mutual inductance between the conductor pairs A and B and with respect to a magnetic resonance imaging application, the magnetic flux of concern, i.e. that which is to be eliminated, is the magnetic flux that is perpendicular to the plane containing the conductor pair B. This magnetic field, $B_\perp$ is calculated by the following equation:

$$B_\perp = B_q * x / R. \quad (5)$$

Substituting for $B_q$ and R:

$$B_\perp = (\mu_0 I / 2\pi) * [x / (x^2 + d^2)] \quad (6)$$

Therefore, the total magnetic flux $\phi$ perpendicular to the plane containing conductor pair B due to the current flowing in conductor $A_1$ can be determined by calculating the following integral from $x_0$ to $x_1$:

$$\phi = \int B_\perp dx \quad (7)$$

where $x_0$ is the distance between conductor $B_1$ and the line defined by the intersection of a plane perpendicular to the two planes defined by the conductor pairs and passing through conductor $A_1$ and $x_1$ equals $x_0$ plus s, where s is the spacing between conductors $B_1$ and $B_2$. This value of s is also the spacing between conductors $A_1$ and $A_2$.

By applying the above equations analogously to conductor $A_2$, the total magnetic flux $\phi'$ perpendicular to the plane containing conductor pair B due to the current flowing in conductor $A_2$ can be determined by calculating the following integral from $x_0+s$ to $x_1+s$:

$$\phi' = \int B_\perp dx. \quad (8)$$

It should be noted that for the calculations for conductor $A_2$:

$$R = [(x+s)^2 + d^2]^{1/2}.$$

Therefore, the total perpendicular magnetic flux $\phi_T$ through conductor pair B from current flowing through conductor pair A is:

$$\phi_T = \phi - \phi'. \quad (9)$$

The geometry of conductor pairs A and B is arranged to make $\phi_T$ equal to zero according to the following calculations. In these calculations, the values of d and s are assumed to be an arbitrary value of one. It is to be appreciated that other dimensions, such as the thickness of the substrate and the angle $\alpha$, of the coils pairs could be assumed as a starting point for these calculations and that values other than one could be assumed for d and s.

As can be seen from the above equations, $$\varphi = \int_{x_0}^{x_0+s} \frac{x}{(x^2+d^2)} dx$$

and $$\varphi' = \int_{x_1}^{x_1+s} \frac{x}{(x^2+d^2)} dx$$

As noted above, $x_1 = x_0 + s$, and $\phi_T = \phi - \phi'$, therefore:

$$\varphi_T = \frac{1}{2}\ln[(x_0+s)^2+d^2)] - \frac{1}{2}\ln(x_0^2+d^2) - \left[\frac{1}{2}\ln[((x_0+s)+s)^2+d^2] - \frac{1}{2}\ln[(x_0+s)^2+d^2]\right]$$

To make the mutual inductance between the conductor pairs equal to zero, $\phi_T$ must be equal to zero. In order to satisfy this condition, d can be determined. As shown below, there are two values of d: $d_1$ and $d_2$ which correspond to two solutions which are mirror images of each other.

$$\begin{bmatrix} d_1 \\ d_2 \end{bmatrix} = \begin{bmatrix} \frac{1}{2}(4x_0^2 + 8x_0 s + 2s^2)^{\frac{1}{2}} \\ -\frac{1}{2}(4x_0^2 + 8x_0 s + 2s^2)^{\frac{1}{2}} \end{bmatrix}$$

Setting $d_1$ to be arbitrary value of one results in the following:

$$\frac{1}{2}(4x_0^2 + 8x_0 s + 2s^2)^{\frac{1}{2}} = 1.$$

From this equation, there are two values of $x_0$: $x_{01}$ and $x_{02}$ that correspond to mirror images of each other:

$$\begin{bmatrix} x_{01} \\ x_{02} \end{bmatrix} = \begin{bmatrix} -s + \frac{1}{2}(2s^2+4)^{\frac{1}{2}} \\ -s - \frac{1}{2}(2s^2+4)^{\frac{1}{2}} \end{bmatrix}$$

Setting s to equal to an arbitrary value of one yields:

$$\begin{bmatrix} x_{01} \\ x_{02} \end{bmatrix} = \begin{bmatrix} 0.225 \\ -2.225 \end{bmatrix}$$

For the angle $\alpha$, as shown in FIG. 5D:

$$\alpha = a\tan\left(\frac{1}{s + \left[-s + \frac{1}{2}(2s^2+4)^{\frac{1}{2}}\right]}\right)$$

therefore, for the value of s=1, $\alpha$=39.23 degrees.

The thickness of the substrate 51 can then be determined by:

thickness = s sin $\alpha$

Therefore, for arbitrary values of d=1, and s=1, the thickness of the plate is 0.632.

It is to be appreciated that the foregoing calculations and dimensions have been presented with respect to infinitely long conductor pairs. However, the calculations can be applied analogously to the loop pairs as shown in FIG. 3A and other embodiments described herein so long as the first and second loops are of similar shape and the spacing between coil pairs is similar.

Figure 6:
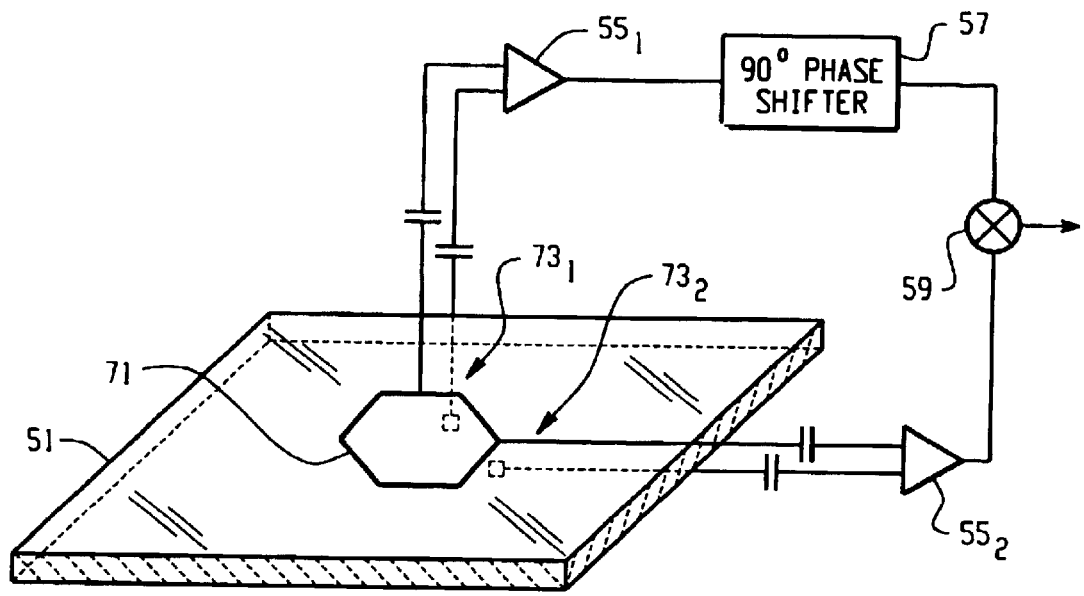
FIG. 6 is a diagrammatic illustration of an embodiment of the present invention wherein the loops on the bottom of the substrate are eliminated.

In an alternate embodiment to the array of coils as shown in FIG. 3A, the loops on the bottom of the substrate 51 are eliminated as shown in FIG. 6. In this embodiment the takeoff points $73_1$, $73_2$ are from the loop 71 disposed on the top of the substrate 51 and from the bottom of the substrate 51. This embodiment functions in quadrature since the pickup of signals is based on the difference between the permittivity of the material of the substrate 51 and free space. Alternatively, the loops on the bottom of the substrate 51 can be replaced by a ground plate and the takeoff points are from the loop disposed on the upper surface of the substrate and the ground plate which is disposed on the bottom of the substrate.

Figure 7A:
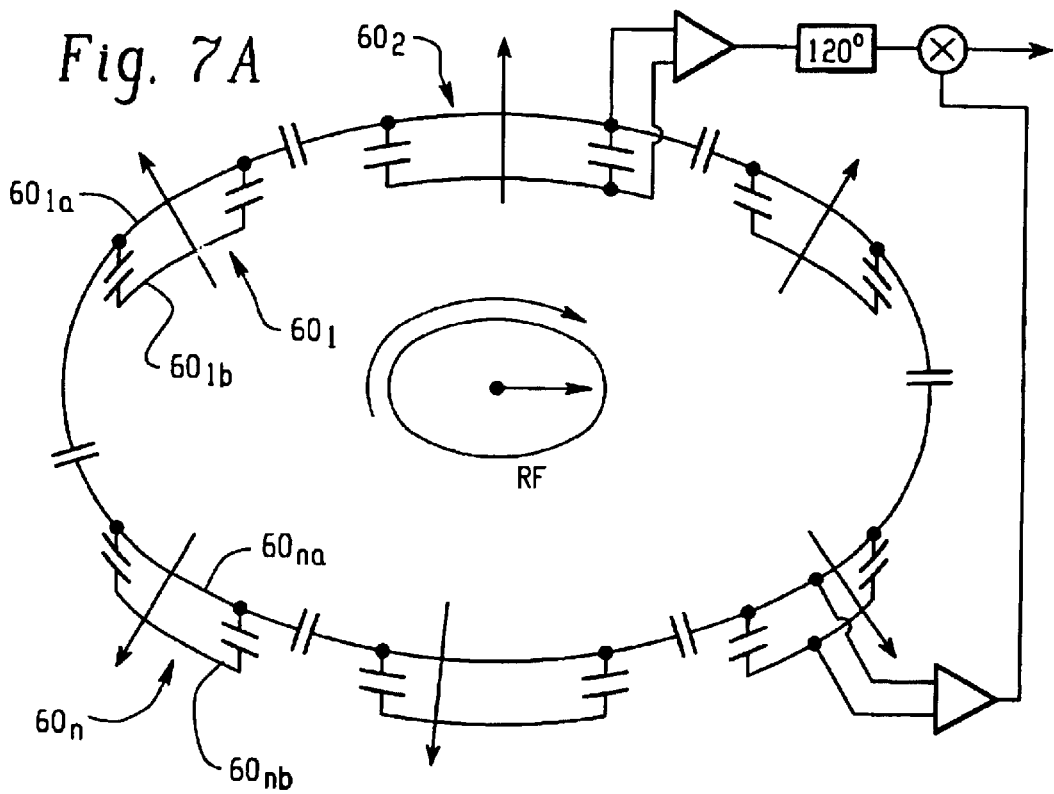
FIG. 7A is a diagrammatic illustration of an embodiment of the present invention wherein the coil pairs and substrate are replaced by a series of narrow coils.
Figure 7B:
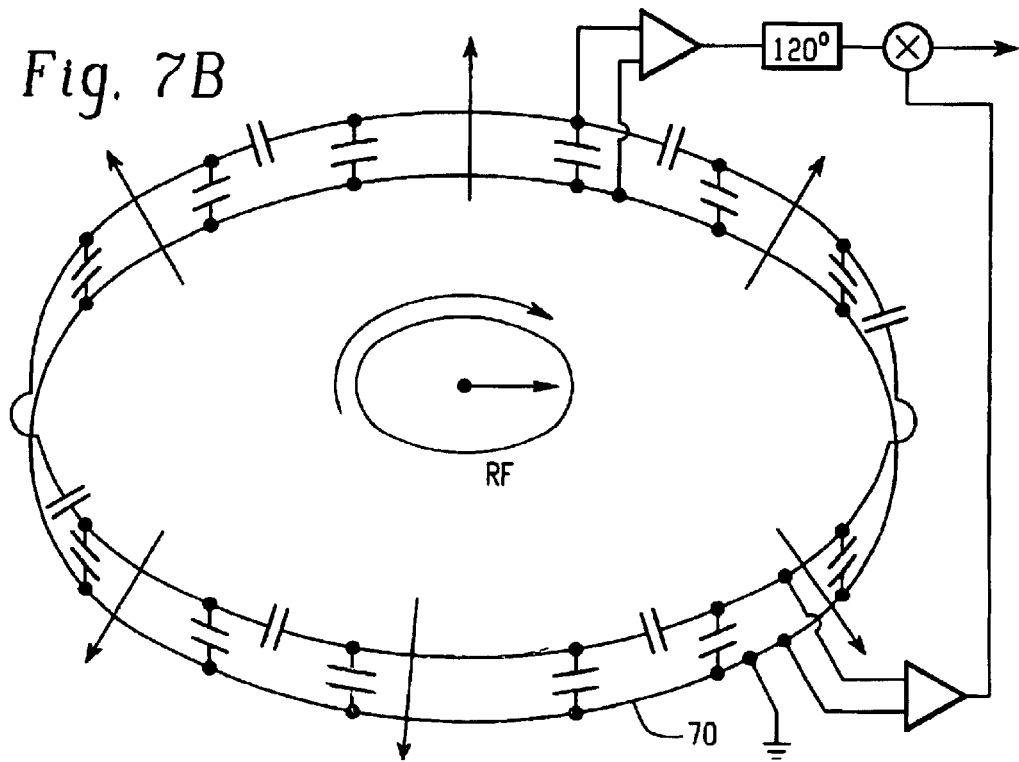
FIG. 7B is a diagrammatic illustration of an embodiment of the present invention wherein the lower coil portions of the embodiment shown in FIG. 7A are replaced by a common ground loop.

With reference to FIG. 7, in another embodiment, the quadrature coils $50_1 \ldots 50_n$ and substrate 51 can be replaced by a series of narrow coils $60_1 \ldots 60_n$ that are capacitively coupled to each other to form a larger loop $60_1$. The narrow coils form a transmission line that can be tuned by proper selection of capacitor values such that the set of narrow coils are sensitive to radio frequency signals that are perpendicular to the plane in which each loop lies, as shown by the arrows in FIG. 7A. In this embodiments, the upper coil portions $60_{1a} \ldots 60_{na}$ are preferably capacitively coupled to the lower coil segments $60_{1a} \ldots 60_{na}$. Alternately, the narrow coils can be formed with a common ground loop 70 replacing the lower coil elements.

Figure 8:
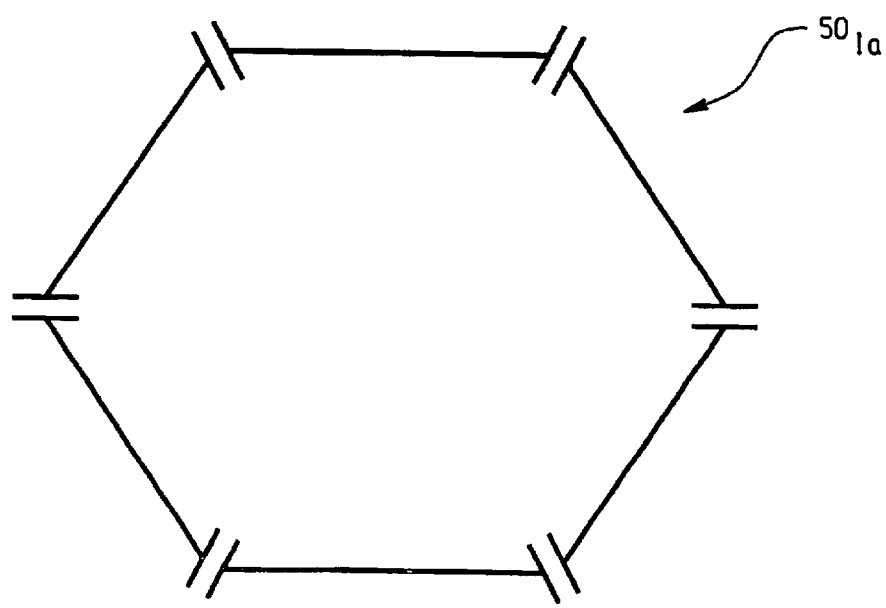
FIG. 8 is a diagrammatic illustration of an embodiment of the present invention wherein the loops within each coil are opened and connected capacitively.

In yet another embodiment, in the case where the coils pairs are made up of closed loops, the closed loops can be opened at one or several places and connected capacitively as shown in FIG. 8. The capacitive coupling is implemented to avoid harmful eddy current effects from the use of gradient fields in the magnetic resonance imaging system.

Figure 9:
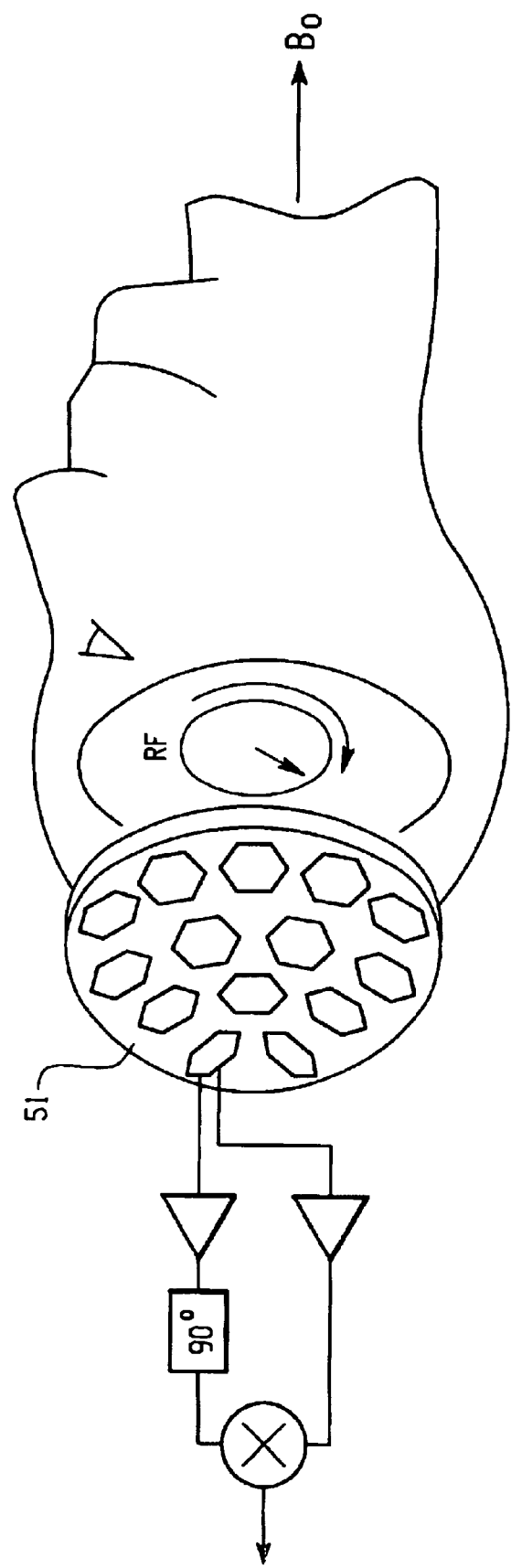
FIG. 9 is a diagrammatic illustration of an embodiment of the present invention wherein the substrate is curved.

Another embodiment is shown in FIG. 9 wherein the substrate 51 is not planar, but is curved. The curvature of the substrate 51 in this embodiment is selected so that it (the curvature) is large enough so that the coil system conforms to a surface of a subject under investigation, e.g. the top of subject's head for brain imaging as shown, yet is small enough so that the radio frequency reception and the mutual inductance between coil pairs are minimally effected by the curvature.

In another embodiment there can be multiple takeoff points on each quadrature coil. For example, there can be takeoff points on each side of the hexagon.

In another alternate embodiment, while there is a separate preamplifier for each takeoff point, the preamplifiers can share common electrical circuitry such as that required for power supply and for grounding purposes.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

What is claimed is:

1. A magnetic resonance imaging apparatus comprising:
   a main magnet assembly for generating a main magnetic field in a main magnetic field direction in an examination region;
   a gradient coil assembly for generating magnetic gradient fields in the main magnetic field within the examination region;
   a radio frequency transmit coil assembly for exciting resonance in selected dipoles within a subject disposed in the examination region such that the dipoles generate circularly polarized resonance signals at a characteristic resonance frequency;
   a radio frequency receive coil assembly for receiving the circularly polarized resonance signals generated by the dipoles; and
   a reconstruction processor for reconstructing the received signals into an image representation, the radio frequency receive coil assembly being disposed in the examination region substantially perpendicular to the main magnetic field direction and comprising:
      a substantially planar substrate; and
      an array of quadrature coils disposed on the substrate, each quadrature coil comprising a first loop portion disposed on a first surface of the substrate and a second loop portion disposed on a second surface of the substrate.

2. A magnetic resonance apparatus according to claim 1 wherein the second loop portion comprises an offset from the first loop portion, the offset comprising a displacement in a direction perpendicular to the main magnetic field direction whereby mutual inductance between adjacent quadrature coils in the array is substantially eliminated.

3. A magnetic resonance imaging apparatus according to claim 1 wherein the main magnet assembly comprises a vertical field magnet.

4. A magnetic resonance imaging apparatus according to claim 3 wherein the radio frequency coil assembly comprises a surface coil.

5. A magnetic resonance imaging apparatus according to claim 4 wherein the first anti second loop portions are hexagonally shaped.

6. A magnetic resonance imaging apparatus according to claim 1 wherein the first loop portion is capacitively coupled to the second loop portion to form a plurality or coils, each of the plurality of coils being sensitive to radio frequency signals perpendicular to the main magnetic field direction.

7. A magnetic resonance imaging apparatus according to claim 6 wherein the second loop portion comprises a common ground loop.

8. A magnetic resonance imaging apparatus according to claim 1 wherein there is no overlap between adjacent quadrature coils in the array of quadrature coils.

9. A magnetic resonance imaging apparatus according to claim 1 wherein each quadrature coil further comprises at least two takeoff points for taking signals off the quadrature coil and a phase shifter and combiner associated therewith for combining the signals in quadrature.

10. A method of magnetic resonance imaging comprising:
   generating a main magnetic field in a main direction in an examination region;
   generating magnetic field gradients in the main magnetic field;
   transmitting radio frequency signals into the examination region to excite selected dipoles in a subject disposed in the examination region such that the dipoles are circularly polarized in a plane perpendicular to the main direction; and
   receiving circularly polarized radio frequency signals from the excited dipoles using a receive coil assembly, the receive coil assembly comprising an army of quadrature coils, each quadrature coil for receiving the radio frequency signals from the circularly polarized dipoles and comprising a first loop portion disposed on a first side of a substrate and a second loop portion disposed on a second side of a substrate, opposite the first side, such that there is substantially no mutual inductance between adjacent quadrature coils of the array.

11. A method of magnetic resonance imaging according to claim 10 further comprising the steps of:
   taking off signals from each quadrature coil from at least two takeoff points;
   phase shifting the signals from the at least two takeoff points; and
   combining the phase shifted signals in quadrature.

12. A method of magnetic resonance imaging according to claim 10 wherein the step of generating the main magnetic field comprises generating a vertical magnetic field using an open magnet.

13. A method of magnetic resonance imaging according to claim 10 wherein the array of quadrature coils comprises a two dimensional array and the array is disposed in the examination region substantially perpendicular to the main direction.

14. A radio frequency receive coil assembly for receiving circularly polarized resonance signals in a magnetic resonance imaging system, the radio frequency receive coil assembly comprising:
   a substantially planar substrate; and an array of quadrature coils disposed on the substrate, each quadrature coil comprising a first loop portion disposed on a first surface of the substrate and a second loop portion disposed on a second surface of the substrate, the second surface being opposite the first surface; wherein adjacent quadrature coils in the array are disposed relative to one another such that there is substantially no mutual inductance between the adjacent coils.

15. A radio frequency receive coil assembly according to claim 14 wherein there is no overlap between the adjacent coils.

16. A radio frequency coil assembly according to claim 14 wherein the assembly comprises a surface coil.

17. A radio frequency coil assembly according to claim 16 wherein the array comprises a two-dimensional array and the circularly polarized resonance signals comprise signals in a direction that is parallel to the array.

18. A radio frequency coil assembly according to claim 14 wherein the assembly further comprises a radio frequency transmit coil.

* * * * *